(12) United States Patent
Brooks et al.

(10) Patent No.: US 7,371,485 B2
(45) Date of Patent: May 13, 2008

(54) MULTI-STEP PROCESS FOR ETCHING PHOTOMASKS

(75) Inventors: Cynthia B. Brooks, Austin, TX (US); Melisa J. Buie, San Jose, CA (US); Brigitte C. Stoehr, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 313 days.

(21) Appl. No.: 11/264,189

(22) Filed: Oct. 31, 2005

(65) Prior Publication Data

US 2006/0049137 A1    Mar. 9, 2006

Related U.S. Application Data

(63) Continuation of application No. 10/803,867, filed on Mar. 18, 2004, now Pat. No. 6,960,413.

(60) Provisional application No. 60/456,518, filed on Mar. 21, 2003.

(51) Int. Cl.
*G03F 9/00* (2006.01)
*G03C 5/00* (2006.01)

(52) U.S. Cl. .................. 430/5; 430/311; 430/313; 430/316; 430/318; 430/319; 430/323; 216/67

(58) Field of Classification Search ............ 430/5, 430/311, 313, 316, 318, 319, 323; 216/67
See application file for complete search history.

(56) References Cited

U.S. PATENT DOCUMENTS

| | | | |
|---|---|---|---|
| 4,350,563 A | 9/1982 | Takada et al. | |
| 4,406,733 A | 9/1983 | Tachi et al. | |
| 4,504,574 A | 3/1985 | Meyer et al. | |
| 4,600,686 A | 7/1986 | Meyer et al. | |
| 5,538,816 A | 7/1996 | Hashimoto et al. | |
| 5,750,290 A | 5/1998 | Yasuzato et al. | |
| 5,773,199 A | 6/1998 | Linliu et al. | |
| 5,861,233 A | 1/1999 | Sekine et al. | |
| 5,948,570 A | 9/1999 | Kornblit et al. | |
| 5,994,235 A | 11/1999 | O'Donnell | |
| 6,007,732 A | 12/1999 | Hashimoto et al. | |
| 6,033,979 A | 3/2000 | Endo | |
| 6,037,265 A | 3/2000 | Mui et al. | |
| 6,080,529 A | 6/2000 | Ye et al. | |
| 6,114,250 A | 9/2000 | Ellingboe et al. | |
| 6,214,637 B1 | 4/2001 | Kim et al. | |
| 6,251,217 B1 | 6/2001 | Ye et al. | |
| 6,391,791 B1 | 5/2002 | Sasaki et al. | |
| 6,472,107 B1 | 10/2002 | Chan | |
| 6,635,185 B2 | 10/2003 | Demmin et al. | |
| 6,709,901 B1 | 3/2004 | Yamazaki et al. | |
| 2003/0003374 A1 | 1/2003 | Buie et al. | |
| 2003/0049934 A1 | 3/2003 | Buie et al. | |
| 2004/0000535 A1 | 1/2004 | Mueller et al. | |

FOREIGN PATENT DOCUMENTS

| | | |
|---|---|---|
| DE | 27 01 458 | 1/1977 |
| EP | 0 054 736 | 6/1982 |
| EP | 0 978 870 | 2/2000 |
| EP | 0 999 472 | 5/2000 |
| JP | 60 016422 | 1/1985 |
| JP | 60 219748 | 11/1985 |
| JP | 62 181433 | 8/1987 |
| JP | 11-131263 | 5/1999 |
| JP | 2001-33940 | 6/2003 |
| WO | WO 00/67281 | 11/2000 |
| WO | WO 01/96955 | 12/2001 |

OTHER PUBLICATIONS

Aoyama, et al. "Advanced Cr Dry Etching Process" SPIE Symposium on Photomask and X-Ray Technology VI, Yokohama, Japan, (Sep. 1999) SPIE, vol. 3748 pp 137-146.
Fujisawa, et al. "Evaluation of NLD Mask Dry Etching System" SPIE Symposium on Photomask and X-Ray Technology VI, Yokohama, Japan, (Sep. 1999) vol. 3748 pp. 147-152.
Kwon, et al., "Loading Effect Parameters at Dry Etcher System and Their Analysis at Mask-to-Mask Loading and Within-Mask Loading" Proceedings of SPIE, vol. 4562 (2002) pp. 79-87.
Mohri, et al., "Manufacturing of Half-Tone Phase Shift Masks: I. Blank" Proceedings of the SPIE-The International Society for Optical Engineering USA, vol. 2254, 1994, pp. 238-247.
Miyashita, et al., " Manufacturing of Half-Tone Phase Shift Masks: II. Writing and Process", Proceedings of the SPIE—The International Society for Optical Engineering USA, vol. 2254, 1994, pp. 248-260.
Ruhl, et al. "Chrome Dry Etch Process Characterization Using Surface Nano Profiling" Proceedings of SPIE, vol. 4186 (2001) pp. 97-107.
PCT International Search Report for PCT/US04/008335, dated Feb. 14, 2005.
PCT Written Opinion for PCT/US04/008335, dated Feb. 14, 2005.
PCT International Search Report for PCT/US03/11549, dated Feb. 19, 2004.
PCT International Search Report for PCT/US 01/19282, dated May 31, 2002.
PCT International Search Report for PCT/US02/27869, dated Dec. 23. 2002.

*Primary Examiner*—Christopher G. Young
(74) *Attorney, Agent, or Firm*—Patterson & Sheridan LLP

(57) ABSTRACT

Method and apparatus for etching a metal layer disposed on a substrate, such as a photolithographic reticle, are provided. In one aspect, a method is provided for processing a photolithographic reticle including positioning the reticle on a support member in a processing chamber, wherein the reticle comprises a metal photomask layer formed on a silicon-based substrate, and a patterned resist material deposited on the silicon-based substrate, etching the substrate with an oxygen-free processing gas, and then etching the substrate with an oxygen containing processing gas.

19 Claims, 3 Drawing Sheets

US 7,371,485 B2

MULTI-STEP PROCESS FOR ETCHING PHOTOMASKS

CROSS-REFERENCE TO RELATED APPLICATIONS

This application is a Continuation Application of U.S. patent application Ser. No. 10/803,867, filed Mar. 18, 2004, now U.S. Pat No. 6,960,413 which application claims benefit of U.S. Provisional Patent Application Ser. No. 60/456,518, filed Mar. 21, 2003, which applications are incorporated herein by reference.

BACKGROUND OF THE INVENTION

1. Field of the Invention

The present invention relates to the fabrication of integrated circuits and to the fabrication of photolithographic reticles useful in the manufacture of integrated circuits.

2. Background of the Related Art

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's fabrication plants are routinely producing devices having 0.15 µm and even 0.13 µm feature sizes, and tomorrow's plants soon will be producing devices having even smaller geometries.

The increasing circuit densities have placed additional demands on processes used to fabricate semiconductor devices. For example, as circuit densities increase, the widths of vias, contacts and other features, as well as the dielectric materials between them, decrease to sub-micron dimensions, whereas the thickness of the dielectric layers remains substantially constant, with the result that the aspect ratios for the features, i.e., their height divided by width, increases. Reliable formation of high aspect ratio features is important to the success of sub-micron technology and to the continued effort to increase circuit density and quality of individual substrates.

High aspect ratio features are conventionally formed by patterning a surface of a substrate to define the dimensions of the features and then etching the substrate to remove material and define the features. To form high aspect ratio features with a desired ratio of height to width, the dimensions of the features are required to be formed within certain parameters, which are typically defined as the critical dimensions of the features. Consequently, reliable formation of high aspect ratio features with desired critical dimensions requires precise patterning and subsequent etching of the substrate.

Photolithography is a technique used to form precise patterns on the substrate surface and then the patterned substrate surface is etched to form the desired device or features. Photolithography techniques use light patterns and resist materials deposited on a substrate surface to develop precise patterns on the substrate surface prior to the etching process. In conventional photolithographic processes, a resist is applied on the layer to be etched, and the features to be etched in the layer, such as contacts, vias, or interconnects, are defined by exposing the resist to a pattern of light through a photolithographic reticle having a photomask layer disposed thereon. The photomask layer corresponds to the desired configuration of features. A light source emitting ultraviolet (UV) light or low energy X-ray light, for example, may be used to expose the resist to alter the composition of the resist. Generally, the exposed resist material is removed by a chemical process to expose the underlying substrate material. The exposed underlying substrate material is then etched to form the features in the substrate surface while the retained resist material remains as a protective coating for the unexposed underlying substrate material.

Photolithographic reticles typically include a substrate made of an optically transparent material, such as quartz or fused silica (i.e., silicon dioxide, $SiO_2$), having an opaque light-shielding layer of metal, or photomask, typically chromium, deposited on the surface of the substrate. The light-shielding layer is patterned to correspond to the features to be transferred to the substrate. Generally, conventional photolithographic reticles are fabricated by first depositing a thin metal layer on a substrate comprising an optically transparent material, such as quartz, and depositing a resist layer on the thin metal layer. The resist is then patterned using conventional laser or electron beam patterning equipment to define the critical dimensions to be transferred to the metal layer. The metal layer is then etched to remove the metal material not protected by the patterned resist; thereby exposing the underlying material and forming a patterned photomask layer. Photomask layers allow light to pass therethrough in a precise pattern onto the substrate surface.

Conventional etching processes, such as wet etching, tend to etch isotropically, which can result in an undercut phenomenon to occur in the metal layer below the patterned resist. The undercut phenomenon can produce patterned features on the photomask that are not uniformly spaced and do not have the desired straight, vertical sidewalls, thereby losing the critical dimensions of the features. Additionally, the isotropic etching of the features may overetch the sidewalls of features in high aspect ratios, resulting in the loss of the critical dimensions of the features. Features formed without the desired critical dimensions in the metal layer can detrimentally affect light passing therethrough and result in less than desirable patterning by the photomask in subsequent photolithographic processes.

Plasma etch processing, known as dry etch processing or dry etching, provides an alternative to wet etching and provides a more anisotropic etch than wet etching processes. The dry etching process has been shown to produce less undercutting and improve the retention of the critical dimensions of the photomask features with straighter sidewalls and flatter bottoms. In conventional dry etching processing, a plasma of etching gases is used to etch the metal layers formed on the substrate.

However, dry etching may overetch or imprecisely etch the sidewalls of the openings or pattern formed in the resist material used to define the critical dimensions of the metal layer. Excess side removal of the resist material results in a loss of the critical dimensions of the patterned resist features, which may correspond in a loss of critical dimensions of the features formed in the metal layer defined by the patterned resist layer. Further, imprecise etching may not sufficiently etch the features to provide the necessary critical dimensions. Failure to sufficiently etch the features to the critical dimensions is referred to as a "gain" of critical dimensions. The degree of loss or gain of the critical dimensions in the metal layer is referred to as "etching bias" or "CD bias". The etching bias can be as large as 120 nm in photomask patterns used to form 0.14 µm features on substrate surfaces.

Additionally, the metal layer, particularly the surface of the metal layer, may incorporate contaminants, such as oxygen and nitrogen, which are more sensitive to etching radicals than the metal layer alone, and can result in the loss of critical dimensions. Also, an anti-reflective coating (ARC) may be deposited on the metal layer to improve the precision of a photolithographic process for patterning a photoresist layer and then etching the metal layer. However, the anti-reflective coating may comprise inorganic matter, and similar to the contaminated metal layer described above, become overetched and result in the loss of critical dimensions.

The loss or gain of critical dimensions of the pattern formed in the metal layer can detrimentally affect the light passing therethrough and produce numerous patterning and subsequent etching defects in the substrate patterned by the photolithographic reticle. The loss or gain of critical dimensions of the photomask can result in insufficient photolithographic performance for etching high aspect ratios of submicron features, and, if the loss or gain of critical dimensions is severe enough, can also result in the failure of the photolithographic reticle or subsequently etched device.

One solution to preserving the critical dimensions of a feature is to use processing gases containing passivating materials, such as hydrocarbons, which may form polymeric deposits on the sidewalls of features and prevent overetching. However, polymer-forming compounds may deposit on chamber components and become a source of particulate matter in the processing chamber. Particulate matter may deposit on the substrate surface and detrimentally affect the etching process as well as subsequent processing.

Therefore, there remains a need for a process and chemistry for etching a metal layer on a substrate, such as a reticle, which produces a pattern with desired critical dimensions in the metal layer.

SUMMARY OF THE INVENTION

Aspects of the invention generally provide methods and related chemistry for etching a metal layer deposited on an optically transparent substrate, such as a photolithographic reticle. In one aspect, a method is provided for processing a photolithographic reticle including positioning the reticle on a support member in a processing chamber, wherein the reticle comprises a metal photomask layer formed on a silicon-based substrate, an anti-reflective coating disposed on the metal photomask layer and a patterned resist material deposited on the anti-reflective coating, etching the anti-reflective coating with an oxygen-free processing gas, and etching the metal photomask layer with an oxygen containing processing gas.

In another aspect, a method is provided for processing a photolithographic reticle including positioning the reticle on a support member in a processing chamber, wherein the reticle comprises a metal photomask layer formed on a silicon-based substrate, an anti-reflective coating disposed on the metal photomask layer and a patterned resist material deposited on the anti-reflective coating, introducing an oxygen-free processing gas into the processing chamber, generating a plasma of the oxygen-free processing gas, removing exposed portions of the anti-reflective coating, introducing an oxygen containing gas into the processing chamber, and removing exposed portions of the metal photomask layer.

In yet another aspect, a method is provided for processing a reticle including positioning the reticle on a support member in a processing chamber, wherein the reticle comprises a metal photomask layer formed on a silicon-based substrate, and a patterned resist material deposited on the anti-reflective coating, etching the metal photomask layer with a processing gas for a first period of time, wherein the processing gas has a first oxygen concentration, increasing the oxygen concentration of the processing gas to a second oxygen concentration greater than the first oxygen concentration, and etching the metal photomask layer with the processing gas for a second period of time at the second oxygen concentration.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE EXEMPLARY EMBODIMENT

Aspects of the invention will be described below in reference to an inductively coupled plasma etch chamber. Suitable inductively coupled plasma etch chambers include the ETEC Tetra™ photomask etch chamber available from ETEC of Hayward, Calif., or optionally, the Decoupled Plasma Source (DPS™) chamber available from Applied Materials, Inc., of Santa Clara, Calif. Other process chambers may be used to perform the processes of the invention, including, for example, capacitively coupled parallel plate chambers and magnetically enhanced ion etch chambers as well as inductively coupled plasma etch chambers of different designs. Although the processes are advantageously performed with the ETEC Tetra™ photomask etch chamber, the description in conjunction with the DPS™ processing chamber is illustrative, and should not be construed or interpreted to limit the scope of any aspect of the invention.

Figure 1:
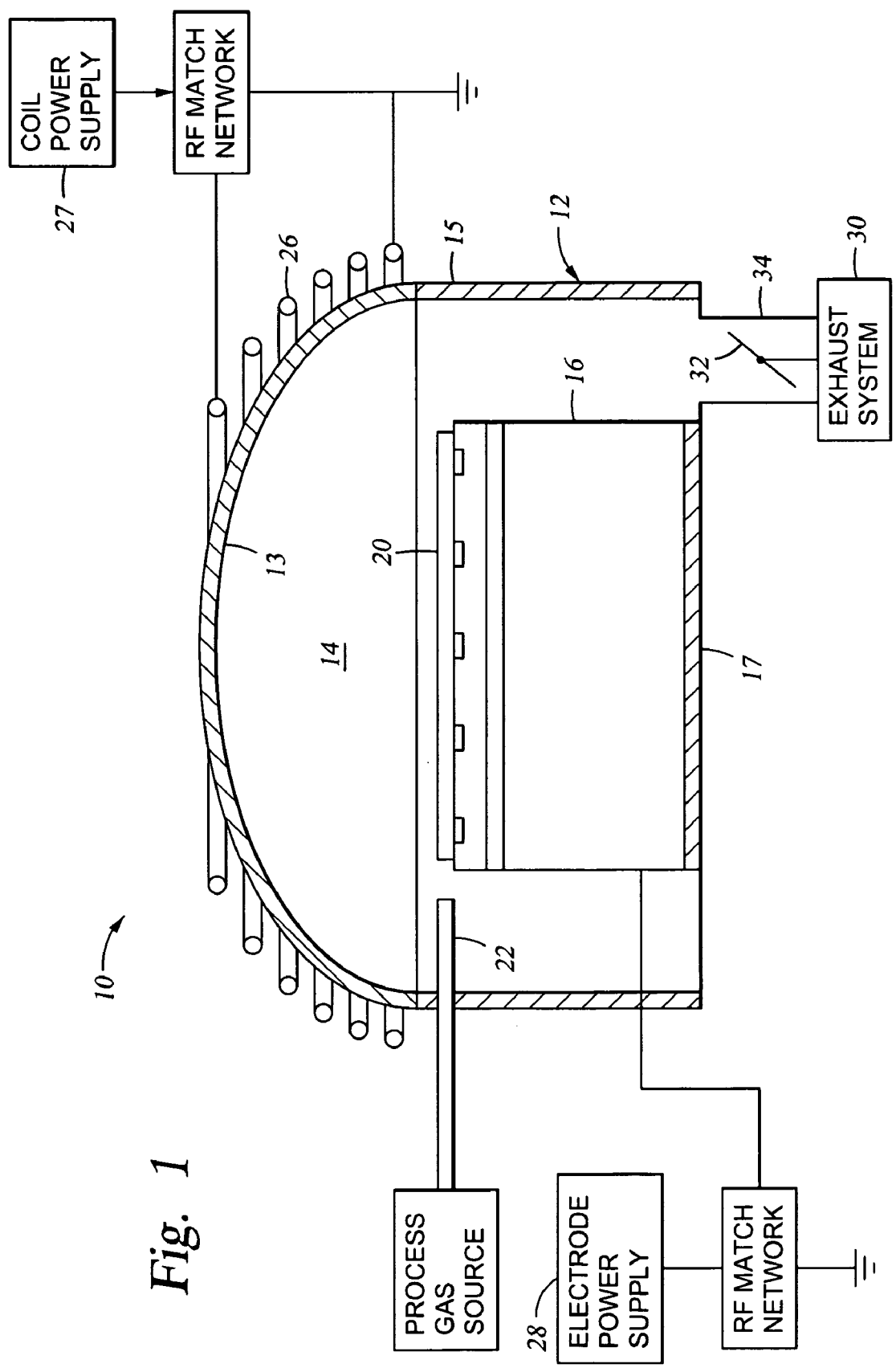
FIG. 1 is a schematic cross-sectional view of one embodiment of an etching chamber.

FIG. 1 is a schematic cross-sectional view of one embodiment of a DPS™ processing chamber that may be used for performing the processes described herein. The processing chamber 10 generally includes a cylindrical sidewall or chamber body 12, an energy transparent dome ceiling 13 mounted on the body 12, and a chamber bottom 17. An inductive coil 26 is disposed around at least a portion of the dome 13. The chamber body 12 and the chamber bottom 17 of the processing chamber 10 can be made of a metal, such as anodized aluminum, and the dome 13 can be made of an energy transparent material such as a ceramic or other dielectric material.

A substrate support member 16 is disposed in the processing chamber 10 to support a substrate 20 during processing. The support member 16 may be a conventional mechanical or electrostatic chuck with at least a portion of the support member 16 being electrically conductive and capable of serving as a process bias cathode. While not shown, a reticle adapter may be used to secure the reticle on the support member 16. The reticle adapter generally includes a lower portion milled to cover an upper portion of the support member and a top portion having an opening that is sized and shaped to hold a reticle. A suitable reticle adapter is disclosed in U.S. Pat. No. 6,251,217, issued on Jun. 26, 2001, which is incorporated herein by reference to the extent not inconsistent with aspects and claims of the invention.

Processing gases are introduced into the processing chamber 10 from a process gas source (not shown) through a gas distributor 22 peripherally disposed about the support member 16. Mass flow controllers (not shown) for each processing gas, or alternatively, for mixtures of the processing gases, are disposed between the processing chamber 10 and the process gas source to regulate the respective flow rates of the process gases. The mass flow controllers can regulate up to about 1000 sccm flow rate for each processing gas or processing gas mixture.

A plasma zone 14 is defined by the process chamber 10, the substrate support member 16 and the dome 13. A plasma is formed in the plasma zone 14 from the processing gases using a coil power supply 27 which supplies power to the inductor coil 26 to generate an electromagnetic field in the plasma zone 14. The support member 16 includes an electrode disposed therein, which is powered by an electrode power supply 28 and generates a capacitive electric field in the processing chamber 10. Typically, RF power is applied to the electrode in the support member 16 while the body 12 is electrically grounded. The capacitive electric field is transverse to the plane of the support member 16, and influences the directionality of charged species more normal to the substrate 20 to provide more vertically oriented anisotropic etching of the substrate 20.

Process gases and etchant byproducts are exhausted from the process chamber 10 through an exhaust system 30. The exhaust system 30 may be disposed in the bottom 17 of the processing chamber 10 or may be disposed in the body 12 of the processing chamber 10 for removal of processing gases. A throttle valve 32 is provided in an exhaust port 34 for controlling the pressure in the processing chamber 10. An optical endpoint measurement device can be connected to the processing chamber 10 to determine the endpoint of a process performed in the chamber.

While the following process description illustrates one embodiment of etching a substrate by the processing gases described herein, the invention contemplates the use of processing parameters outside the ranges described herein for performing this process in different apparatus, such as a different etching chamber, and for different substrate sizes, such as photolithographic reticles for 300 mm substrate processing.

Etch Process Conditions

Generally a photolithographic reticle includes an opaque layer known as a photomask, deposited on an optically transparent substrate material. The opaque layer may comprise a metal layer, for example, chromium, or another material known or unknown in the art suitable for use as a photomask, such as amorphous carbon. An optically transparent material of the substrate is broadly defined to include, but not limited to, a material transparent to lights having wavelengths of about 300 nm or less, for example, transparent to ultraviolet light having wavelengths of 248 nm and 193 nm.

An anti-reflective coating (ARC or ARC layer) may be formed on or comprise part of the deposited metal layer. The ARC layer is believed to improve photolithographic precision in patterning features to be formed in the opaque layer.

The ARC layer may be a metal layer incorporating nonmetallic contaminants or impurities to form, for example a metal oxynitride layer, such as chromium oxynitride. Chromium oxynitride may be formed during deposition of the metal layer or by exposing the metal layer to a suitable atmosphere. The metal oxynitride layer may comprise up to the top 30% of the total thickness of the metal layer or up to the top 30% of the combined metal layer and ARC material.

The ARC layer and the metal layer are etched by a two-step process to produce a photomask layer having features with desired critical dimensions. The ARC layer is first etched using an oxygen-free first processing gas including a halogen containing gas, and the metal layer is etched using a second processing gas including an oxygen containing gas and a halogen containing gas. The first and second processing gases may further include an inert gas.

The halogen containing gas of both the first and second processing gases may include chlorine containing gases selected from the group of chlorine ($Cl_2$), carbon tetrachloride ($CCl_4$), hydrochloric acid (HCl), and combinations thereof, of which $Cl_2$ is preferred, are used to supply highly reactive radicals to etch the metal layer. The chlorine containing gas provides a source of etching radicals and hydrogen or carbon containing chlorine containing gases may provide a source of material for forming passivating polymer deposits, which may improve etch bias.

The oxygen containing gas includes oxygen ($O_2$), carbon monoxide (CO), carbon dioxide ($CO_2$), and combinations thereof, of which oxygen is preferred. The oxygen containing gas provides a source of etching radicals and carbon containing oxygen containing gases may provide a source of material for passivating polymer deposits, which may improve etch bias.

When the halogen containing gas and the oxygen containing gas are provided in the same processing gas, a molar ratio of halogen containing gas and the oxygen containing gas of between about 1:1.5 and about 8:1, for example a chlorine to oxygen molar ratio of about 2.7:1 or 8:1 is used. The molar ratio translates into the halogen containing gas generally including between about 40% and about 90% of the total moles of the processing gas. A concentration of halogen containing gas of between about 50 vol % and about 75 vol % in the halogen containing and oxygen-containing gas processing gas has been observed to provide satisfactory etching results.

The first and second processing gases may also include an inert gas, that when ionized as part of the plasma including the processing gas, results in sputtering species to increase the etching rate of the features. The presence of an inert gas as part of the plasma may also enhance dissociation of the active processing gases. Examples of inert gases include argon (Ar), helium (He), neon (Ne), xenon (Xe), krypton (Kr), and combinations thereof, of which argon and helium are generally used. The inert gas may be provided in a molar ratio of oxygen containing gas to inert gas of between about 0.5:1 and about 1:1, for example, a helium to oxygen molar ration of about 0.7:1. The inert gases typically comprise between about 5 vol % and about 50 vol %, such as between about 15 vol % and about 25 vol % of the total gas flow for the process.

The total flow rate of the first and second processing gases, including the inert gases, are introduced at a flow rate of greater than about 90 sccm, such as between about 200 sccm and about 400 sccm for etching a 150 mm by 150 mm square photolithographic reticles in an etch chamber. The halogen containing gas is introduced into the processing chamber at a flow rate of between about 100 sccm and about 350 sccm for etching a 150 mm by 150 mm square photolithographic reticles in an etch chamber. When the oxygen containing gas is introduced into the processing chamber, a flow rate between about 25 sccm and about 100 sccm for etching a 150 mm by 150 mm square photolithographic reticles in an etch chamber. When the inert gas is introduced into the processing chamber, a flow rate between about 25 sccm and about 100 sccm for etching a 150 mm by 150 mm square photolithographic reticles in an etch chamber.

The individual and total gas flows of the processing gases, may vary based upon a number of processing factors, such as the size of the processing chamber, the size of the substrate being processed, and the specific etching profile desired by the operator.

Generally, the processing chamber pressure is maintained between about 2 milliTorr and about 50 milliTorr. A chamber pressure between about 4 milliTorr and about 35 milliTorr, preferably between about 5 milliTorr and about 10 milliTorr may be maintained during etch processing.

The substrate temperature during processing is about 150° C. or less. A substrate temperature below about 150° C. or less has minimal heat degradation of materials, such as resist materials, deposited on the substrate during the photolithographic reticle fabrication processes with the processing gases described herein. The substrate temperature between about 20° C. and about 150° C., preferably between about 20° C. and about 50° C., may be used to etch photomask features with minimal heat degradation of material disposed on the substrate surface. It is also believed that the substrate temperature helps regulate the formation of passivating polymer deposits by limiting polymerization reactions during the etching process. Additionally, the sidewalls of the processing chamber are maintained at a temperature of less than about 70° C., and the dome is maintained at a temperature of less than or equal to about 80° C. to maintain consistent processing conditions and to minimize polymer formation on the surfaces of the processing chamber.

Generally, a source RF power level of about 1000 watts or less is applied to an inductor coil to generate and sustain a plasma of the processing gases during etch processing. A power level between about 300 watts and about 1000 watts, such as about 650 watts, has been observed to provide sufficient plasma of the processing gases sufficient for etching the substrate surface. The recited source RF power levels have been observed to produce sufficient etching radicals and polymerization radicals from the processing gases to etch the exposed metal layer disposed on the substrate while providing a sufficiently low power level compared to prior art metal etch processes for the substrate temperatures to be about 150° C. or less.

Generally, a bias power of less than about 200 watts is applied to the substrate to increase directionality of the etching radicals with respect to the surface of the substrate. A bias power of less than 50 watts, such as between about 20 watts and about 40 watts, may be used in the etching process. A bias between about 20 watts and 30 watts has been observed to provide sufficient directionality of etching radicals during etch processing.

The exposed material of a substrate surface may be etched by the plasma of the processing gases for between about 15 seconds and about 300 seconds, for example, between about 30 seconds and about 265 seconds, depending on the quantity of material to be etched. The ARC layer may be exposed to the plasma of the first processing gas for between about 5 seconds and about 180 seconds, for example between about 30 seconds and about 60 seconds. The metal layer may be exposed to the plasma of the second processing gas for between about 10 seconds and about 270 seconds, for example between about 90 seconds and about 205 seconds.

The etching process described herein under the conditions disclosed produces a removal rate ratio, i.e., selectivity or etch bias, of ARC layer to resist of about 1:1 or greater. A selectivity of metal to resist of about 1:1 or greater has been observed in substrate processed by the etching process described herein. A selectivity of metal to resist of about 3:1 or greater has been observed in substrate processed by the etching process described herein. The increased selectivity results in the etching processes preserve the critical dimension patterned in the photoresist layer and allows for etched chromium features to have the desired critical dimensions.

The etching processes as described herein were also observed to remove "top" or upper surface resist material independent of "side" within feature resist material, which is consistent with anisotropic etching and improved feature formation. Additionally, processed substrates have produced features with the desired critical dimensions with an almost vertical profile, i.e., an angle of about 90° between the sidewall of the feature and the bottom of the feature compared to prior art result of about 85° to about 88°.

A plasma strike may be used to initiate or generate the plasma prior to one or more of the etching processes described herein. The plasma strike may use an inert gas or a composition of the processing gases described herein. Plasma striking includes establishing the chamber pressure between about 2 milliTorr and about 50 milliTorr, for example, between about 20 milliTorr and about 30 milliTorr, supplying a source power to a coil at a range between about 250 watts and about 1000 watts, such as about 400 watts, and/or supplying a bias at a range between about 1 watt and about 50 watts, such as between about 20 watts and about 40 watts. The source power used to strike the plasma may be less than the power used during etching of the substrate. The processing conditions and the plasma conditions of the plasma strike process may approximate those of the etching process with the processing gas described herein including total flow rates, chamber pressures, source power, and bias power. The plasma strike process may be for about 15 seconds or less, such as between about 3 seconds and about 5 seconds.

Exemplary Etch Process

While the following description illustrates one embodiment of a process sequence for etching metal layers, such as chromium, as photomasks in photolithographic reticle fabrication, it is contemplated that the etching gases may be used to etch other metal layers formed on substrates in semiconductor and photolithographic reticle manufacturing.

Figure 2:
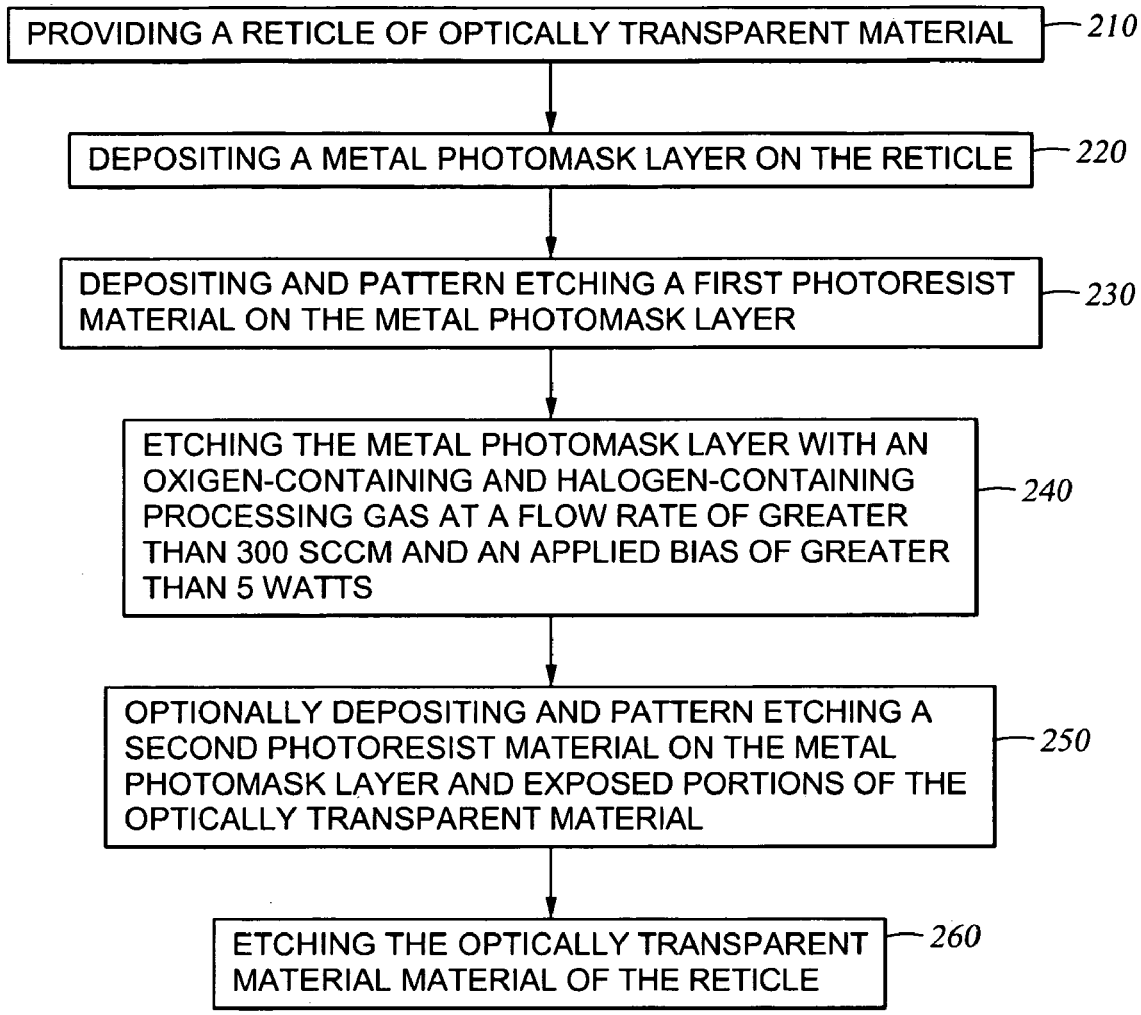
FIG. 2 is a flow chart illustrating one embodiment of a sequence for processing a substrate according to one embodiment of the invention.
Figure 3A:
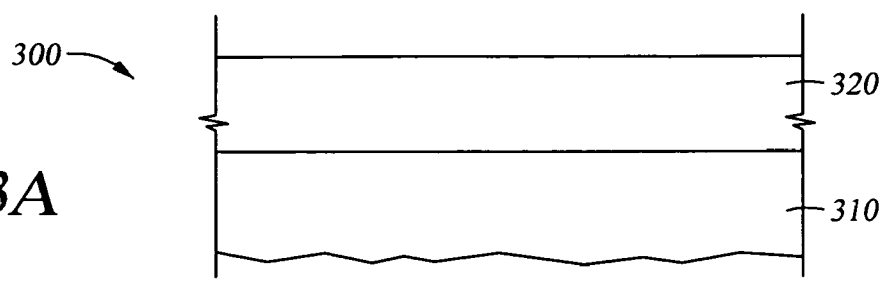
FIGS. 3A-3E are cross-sectional views showing an etching sequence of another embodiment of the invention.
Figure 3B:
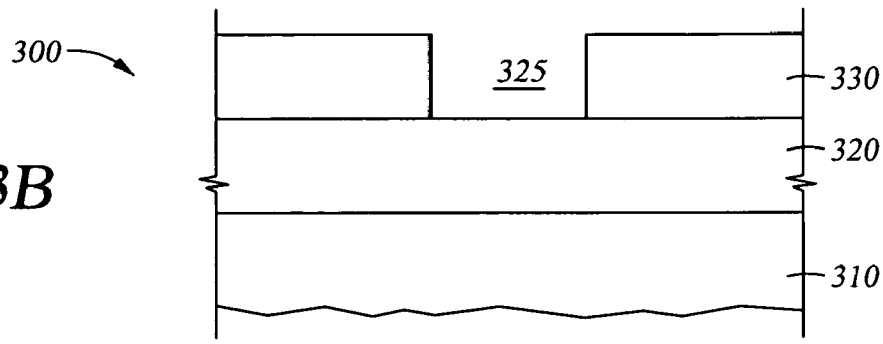
Figure 3C:
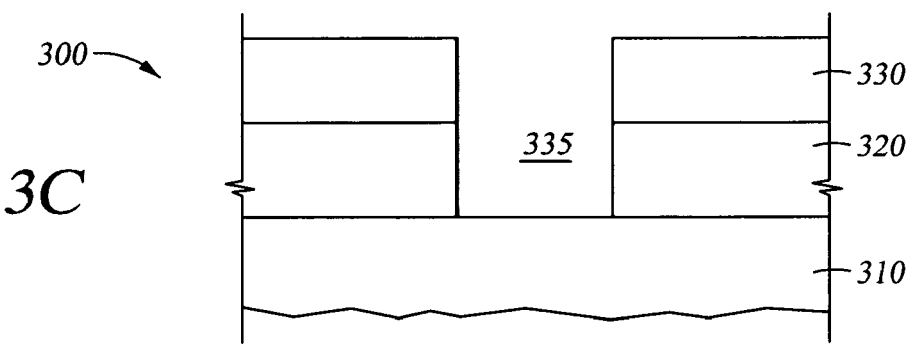

FIG. 2 is a flow chart of one embodiment of one process sequence of an etching process 200. The flow chart is provided for illustrative purposes and should not be construed as limiting the scope of any aspects of the invention. FIGS. 3A-3C illustrate the composition of the photolithographic reticle prior to the etching steps as well as further illustrate the process described above in FIG. 2.

A substrate 300, typically comprising an optically transparent material 310, such as optical quality quartz, fused silica material, molybdenum silicide (MoSi), molybdenum silicon oxynitride ($MoSi_xN_yO_z$), calcium fluoride, alumina, sapphire, or combinations thereof, is provided to a processing chamber at step 210, such as the DPS™ processing chamber 10 of FIG. 1.

The substrate is then processed by depositing an opaque metal layer as a metal photomask layer, typically comprising chromium, on the substrate material 310 at step 220 as shown in FIG. 3A. The chromium layer may be deposited by conventional methods known in the art, such as by physical vapor deposition (PVD) or chemical vapor deposition (CVD) techniques. The metal layer 320 is typically deposited to a thickness between about 50 and about 100 nanometers (nm) thick, however, the depth of the layer may differ based upon the requirements of the manufacturer and the composition of the materials of the substrate or metal layer.

An ARC layer 370, such as chromium oxynitride is formed on the metal layer 320 at step 225, which is also shown in FIG. 3A. The chromium oxynitride layer may be deposited by conventional methods known in the art, such as by physical vapor deposition (PVD) or chemical vapor deposition (CVD) techniques. The ARC layer may be formed by exposing the metal photomask layer 320 to an oxidizing and nitrating environment, such as exposing the chromium layer to an oxygen and nitrogen containing atmosphere to form chromium oxynitride.

The ARC layer 370 is typically formed at a thickness between about 10 nanometers (nm) and about 15 nm thick; however, the depth of the layer may differ based upon the requirements of the manufacturer and the composition of the materials of the substrate or metal layer, and may be mainly concentrated in the upper surface of the deposited material, such as the upper 30% of the thickness of the original metal layer 320. The chromium oxynitride film is believed to be more sensitive to etching with oxygen radicals than chromium films. A reduced amount of oxygen in the processing gas may be used to effectively etch the chromium oxynitride surface compared to etching the bulk of the remaining chromium layer.

The dimensions of openings or patterns to be formed in the ARC layer 370 and the metal layer 320 are patterned by depositing and pattern etching a resist material 330 to expose the ARC layer 370 at step 230 as shown in FIG. 3B. The resist materials used in photolithographic reticle fabrication are usually low temperature resist materials, which is defined herein as materials that thermally degrade at temperatures above about 250° C., an example of which includes "ZEP," manufactured by Hoya Corporation or others described herein. The resist material 330 is deposited upon the ARC layer 370 to a thickness between about 200 nm and about 600 nm.

Resist material may be patterned optically, i.e., photoresist materials, using a laser patterning device or by another radiative energy patterning device, such as an electron beam emitter to form a first opening 325 that is used to define the dimensions of the second opening 335 to be formed in the ARC layer 370 and the metal layer 320.

The substrate 300 is then transferred to an etch chamber, such as the DPS™ processing chamber 10 described above, and the ARC layer 370 and the metal layer 320 are etched by a two-step etching process to form the second opening 335 which exposes the underlying material 310.

Openings and patterns are then formed by etching the ARC layer 370 to expose the underlying metal photomask layer 320 at step 235 using the first processing gas including the halogen containing gas as shown in FIG. 3C. An exemplary processing regime for an ARC layer 370 with the first processing gas described herein is as follows. The substrate is placed on the support member 16, and a processing gas is introduced into the chamber and plasma is generated to etch the ARC layer 370 according to the processes described herein.

The processing gas for etching the ARC layer includes a chlorine gas and an inert gas. The processing gas may be introduced into the processing chamber at a flow rate between about 150 sccm and about 350 sccm during the etching process. Chlorine gas is introduced into the processing chamber at a flow rate between about 120 sccm and about 300 sccm. The inert gas, for example, helium, is introduced into the processing chamber at a flow rate between about 25 sccm and about 91 sccm.

Generally, the processing chamber pressure is maintained between about 5 milliTorr and about 30 milliTorr, for example about 6 milliTorr, about 8 milliTorr, or about 20 milliTorr. A source RF power between about 350 watts and about 650 watts, for example 650 W, is applied to an inductor coil to generate and sustain a plasma of the processing gases during the etching process. A bias power between about 20 watts and about 40 watts, for example about 30 watts, is applied to the substrate support. The etching process is performed between about 30 seconds and about 180 seconds.

The substrate temperature is between about 20° C. and about 100° C. during the etching process. Additionally, the sidewalls 15 of the processing chamber 10 are maintained at a temperature of less than about 70° C. and the dome is maintained at a temperature of less than about 80° C. The above described ARC layer 370 etching process generally produces a selectivity of ARC layer 370 to resist 330 of about 1:1 or greater.

Figure 3D:
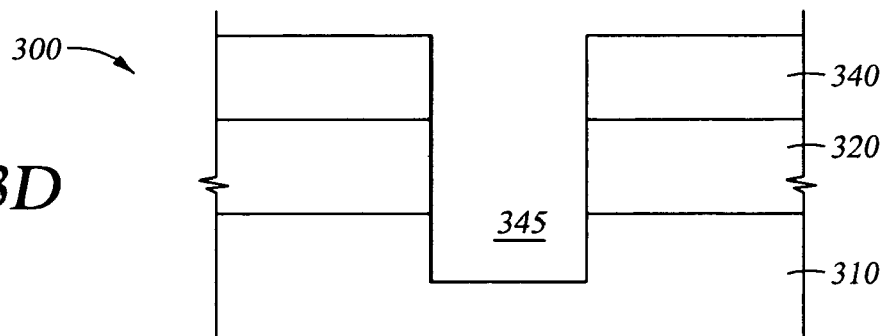

Openings and patterns are then formed in the metal photomask layer by etching the metal photomask layer to expose the underlying substrate at step 240 using the second processing gas including the oxygen containing gas and halogen containing gas as shown in FIG. 3D. A second resist may be applied and patterned on the substrate prior to the second etching process. Optionally, a plasma strike may be used to generate the plasma for etching the metal photomask layer.

An exemplary processing regime for etching metal layer 320 with the second processing gas at the flow rates and bias described herein are as follows. With the substrate remaining on the support member 16, a second processing gas is introduced into the chamber and a plasma is generated or maintained to etch the metal layer 320.

The processing gas for etching the metal photomask layer includes oxygen gas, chlorine gas, and an inert gas. The processing gas may be introduced into the processing chamber at a flow rate between about 150 sccm and about 350 sccm during the etching process. Oxygen gas is introduced into the processing chamber at a flow rate between about 25 sccm and about 100 sccm. Chlorine gas is introduced into the processing chamber at a flow rate between about 200 sccm and about 270 sccm. The inert gas, for example, helium, is introduced into the processing chamber at a flow rate between about 25 sccm and about 70 sccm. The ratio of chlorine gas to oxygen gas in the processing gas is between about 2.7:1 and about 8:1.

Generally, the processing chamber pressure is maintained between about 5 milliTorr and about 30 milliTorr, for example about 6 milliTorr, about 8 milliTorr, or about 20 milliTorr. A source RF power between about 350 watts and about 650 watts, for example 650 watts, is applied to an inductor coil to generate and sustain a plasma of the processing gases during the etching process. A bias power between about 20 watts and about 40 watts, for example about 20 watts, is applied to the substrate support. The etching process is performed between about 90 seconds and about 280 seconds.

The substrate temperature is between about 20° C. and about 100° C. during the etching process. Additionally, the sidewalls 15 of the processing chamber 10 are maintained at a temperature of less than about 70° C. and the dome is maintained at a temperature of less than about 80° C. The above described metal etching process generally produces a selectivity of metal layer to resist of about 3:1 or greater.

Alternatively, an overetch step may be performed after the two-step etching process to ensure removal of all of the desired material from the substrate. The overetch may use a third processing gas of oxygen containing gas and halogen containing gas. The third processing may have a greater amount of oxygen containing gas and lesser amount of halogen containing gas than the second processing gas used for etching the metal photomask layer and facilitating complete removal of the exposed chromium from the substrate surface.

In an optional overetch process, the processing gas for the overetch of the metal photomask layer includes oxygen gas, chlorine gas, and an inert gas. The processing gas may be introduced into the processing chamber at a flow rate between about 150 sccm and about 350 sccm during the etching process. Oxygen gas is introduced into the processing chamber at a flow rate between about 25 sccm and about 200 sccm, for example about 75 sccm. Chlorine gas is introduced into the processing chamber at a flow rate between about 75 sccm and about 300 sccm, for example 200 sccm. The inert gas, for example, helium, is introduced into the processing chamber at a flow rate between about 20 sccm and about 100 sccm, for example 25 sccm. The ratio of chlorine gas to oxygen gas in the overetch processing gas is about 3:1 and about 8:1. In one aspect of the overetch processing gas, the oxygen gas is present in an amount greater than the oxygen gas of the metal photomask etch step, and the chlorine gas is less than the amount of chlorine gas of the metal photomask etch step.

Generally, the processing conditions for the overetch process are the same as for the etch of the metal photomask layer, however, processing conditions may be as follows. The processing chamber pressure is maintained between about 5 milliTorr and about 30 milliTorr, for example about 6 milliTorr, about 8 milliTorr, or about 20 milliTorr. A source RF power between about 350 watts and about 650 watts, for example 650 watts, is applied to an inductor coil to generate and sustain a plasma of the processing gases during the etching process. A bias power between about 20 watts and about 40 watts, for example about 20 watts, is applied to the substrate support. The etching process is performed between about 90 seconds and about 280 seconds, with the total etch time dependent on the amount of exposed chromium.

The substrate temperature is between about 20° C. and about 100° C. during the etching process. Additionally, the sidewalls 15 of the processing chamber 10 are maintained at a temperature of less than about 70° C. and the dome is maintained at a temperature of less than about 80° C. The above described metal etching process generally produces a selectivity of metal layer to resist of about 2:1 or greater.

Endpoints of the ARC layer, the opaque layer, and any residual materials may be monitored by an optical emission endpoint control.

Figure 3E:
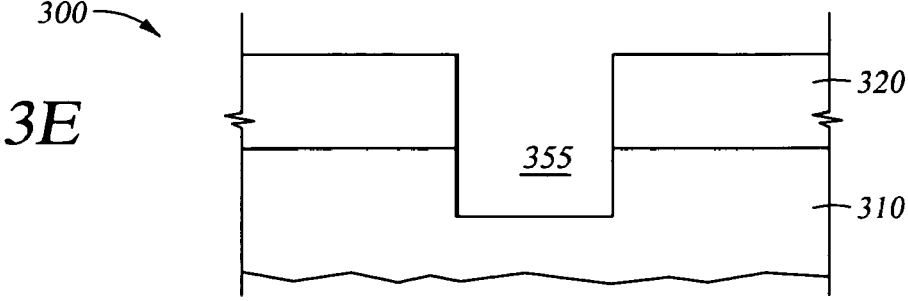

After etching of the metal layer 320 is completed, the substrate 300 is transferred to a processing chamber, and the remaining resist material 330 is usually removed from the substrate 300, such as by an oxygen plasma process, or other resist removal technique known in the art as shown in FIG. 3E.

Optionally, a phase-shift layer (not shown) may used to form a phase attenuated photolithographic substrate. A phase-shift material, such as molybdenum silicide (MoSi) or derivative that may be disposed between the opaque metal layer 320 and the silicon-based substrate surface 310 may then be etched. For example, if a phase-shift material is disposed on the substrate surface prior to deposition of the metal layer 320, the phase-shift layer may be formed by depositing and patterning a second photo resist material on the now patterned metal layer 320 to expose the underlying material at step 250. The underlying material of the phase-shift layer, or the exposed substrate itself if appropriate, may be then be etched with an etching gases suitable for such materials at step 260.

An example of etching of the optically transparent material, such as silicon-based material, of the substrate is more fully described in United States Provisional patent application Ser. No. 10/437,729, filed on May 13, 2003, and U.S. Pat. No. 6,391,790, filed on May 21, 2002, which are incorporated by reference to the extent not inconsistent with the claimed aspects and disclosure herein.

The invention is further described by the following examples that are not intended to limit the scope of the claimed invention.

EXAMPLES

A photolithographic reticle including a substrate made of an optically transparent material, such as optical quality quartz, fused silica, molybdenum silicide, molybdenum silicon oxynitride ($MoSi_xN_yO_z$), calcium fluoride, alumina, sapphire, or combinations thereof, with a chromium photomask layer, for example, between about 70 nanometers (nm) and about 100 nm thick disposed thereon, is introduced into a processing chamber for resist deposition. A layer of chromium oxynitride of about 25% of the total chromium depth is formed as the chromium is deposited or by exposure to an appropriate atmosphere. Generally, the chromium and chromium oxynitride material have a combined thickness between about 70 nm and about 100 nm, with chromium oxynitride comprising about the top 25% of the total thickness of the combined layers. The chromium oxynitride layer may act as an anti-reflective layer.

A resist, such as ZEP, a resist material commercially available from Tokyo-Oka of Japan, or a chemically amplified resist or CAR resist also commercially available from Tokyo-Oka of Japan, is deposited upon the chromium oxynitride layer and then patterned using conventional laser or electron beam patterning equipment. The resist deposited on the substrate is between about 200 nm and about 600 nm thick, for example, between about 300 nm and about 400 nm thick, but may be of any thickness desired.

Example 1

The reticle is placed in an etch chamber such as the DPS™ metal etch chamber described above. The patterned substrate described above is placed on the cathode pedestal of the etch chamber, and the chamber was maintained at a pressure of about 8 milliTorr. A plasma is generated by applying a source RF voltage to the inductive coil at a power level of about 350 watts. A bias power of 20 watts is applied to the cathode pedestal. The etching of the chromium oxynitride ARC layer occurred for approximately 30 seconds under a total flow of 250 sccm with the following gas flows:

| | |
|---|---|
| Oxygen ($O_2$), at | 0 sccm |
| Chlorine gas ($Cl_2$), at | 225 sccm |
| Helium (He), at | 25 sccm |

The etching of the chromium photomask layer occurred for approximately 185 seconds under a total flow of 250 sccm with the following gas flows:

| | |
|---|---|
| Oxygen (O$_2$), at | 25 sccm |
| Chlorine gas (Cl$_2$), at | 200 sccm |
| Helium (He), at | 25 sccm, | with a ratio of chlorine to oxygen of about 8:1. Measured chromium etch profiles observed from this example indicate a near-vertical profile of 88° to 90° in both densely packed features and isolated features. Critical dimension uniformity is maintained at less than or equal to 5 nm, 3σ, relative to the uniformity of the photoresist prior to etch. This represents a 50% improvement in CD uniformity over an equivalent one-step etch process.

Example 2

The reticle is placed in an etch chamber such as the DPS™ metal etch chamber described above. The patterned substrate described above is placed on the cathode pedestal of the etch chamber, and the chamber was maintained at a pressure of about 8 milliTorr. A plasma was generated by applying a source RF voltage to the inductor coil at a power level of about 350 watts. A bias power of 20 watts was applied to the cathode pedestal. The etching of the chromium oxynitride ARC layer occurred for approximately 60 seconds under a total flow of 250 sccm with the following gas flows:

| | |
|---|---|
| Oxygen (O$_2$), at | 0 sccm |
| Chlorine gas (Cl$_2$), at | 225 sccm |
| Helium (He), at | 25 sccm. |

The etching of the chromium photomask layer occurred for approximately 185 seconds under a total flow of 250 sccm with the following gas flows:

| | |
|---|---|
| Oxygen (O$_2$), at | 25 sccm |
| Chlorine gas (Cl$_2$), at | 200 sccm |
| Helium (He), at | 25 sccm, | with a ratio of chlorine to oxygen of about 8:1.

An overetch process of the chromium photomask layer occurred for approximately 150 seconds under a total flow of 250 sccm with the following gas flows:

| | |
|---|---|
| Oxygen (O$_2$), at | 56 sccm |
| Chlorine gas (Cl$_2$), at | 169 sccm |
| Helium (He), at | 25 sccm, | with a ratio of chlorine to oxygen of about 3:1.

While the foregoing is directed to the exemplary aspects of the invention, other and further aspects of the invention may be devised without departing from the basic scope thereof, and the scope thereof is determined by the claims that follow.

What is claimed is:

1. A method for processing a photolithographic reticle, comprising:
    positioning the reticle on a support member in a processing chamber, wherein the reticle comprises a metal photomask layer formed on a silicon-based substrate, an anti-reflective coating disposed on the metal photomask layer and a patterned resist material deposited on the anti-reflective coating;
    etching the anti-reflective coating with an oxygen-free processing gas comprising chlorine and an inert gas; and
    etching the metal photomask layer with an oxygen containing processing gas comprising chlorine, oxygen gas, and an inert gas.

2. The method of claim 1, wherein the metal photomask layer comprises chromium and the anti-reflective coating comprises chromium oxynitride.

3. The method of claim 1, wherein the silicon-based substrate comprises an optically transparent silicon-based material selected from the group of quartz, fused silica, molybdenum silicide, molybdenum silicon oxynitride, and combinations thereof.

4. The method of claim 1, wherein the etching of the reticle comprises introducing the oxygen-free processing gas or the oxygen containing processing gas into the processing chamber, maintaining the processing chamber at a pressure between about 2 milliTorr and about 25 milliTorr, maintaining the reticle at a temperature between about 50° C. and about 150° C., and generating a plasma by supplying a source RF power between about 250 watts and about 700 watts to a coil in the processing chamber.

5. The method of claim 4, further comprising applying a bias power to the support member of about 50 watts or less.

6. The method of claim 1, wherein oxygen comprises between about 5% and about 30% of the oxygen containing processing gas.

7. The method of claim 1, wherein etching the metal photomask layer with an oxygen containing processing gas comprises introducing the oxygen containing processing gas into the processing chamber containing the oxygen-free processing gas while maintaining a plasma.

8. A method for processing a photolithographic reticle, comprising:
    positioning the reticle on a support member in a processing chamber, wherein the reticle comprises a metal photomask layer formed on a silicon-based substrate, an anti-reflective coating disposed on the metal photomask layer and a patterned resist material deposited on the anti-reflective coating;
    introducing an oxygen-free processing gas into the processing chamber comprising chlorine and an inert gas;
    generating a plasma of the oxygen-free processing gas;
    removing exposed portions of the anti-reflective coating;
    introducing oxygen gas into the processing chamber; and
    removing exposed portions of the metal photomask layer.

9. The method of claim 8, wherein the metal photomask layer comprises chromium and the anti-reflective coating comprises chromium oxynitride.

10. The method of claim 8, wherein the silicon-based substrate comprises an optically transparent silicon-based material selected from the group of quartz, fused silica, molybdenum silicide, molybdenum silicon oxynitride, and combinations thereof.

11. The method of claim 8, wherein generating the plasma comprises maintaining the processing chamber at a pressure between about 2 milliTorr and about 25 milliTorr, maintaining the reticle at a temperature between about 50° C. and about 150° C., and supplying a source RF power between about 250 watts and about 700 watts to a coil in the processing chamber.

12. The method of claim 11, further comprising applying a bias power to the support member of about 50 watts or less.

13. The method of claim 8, wherein oxygen comprises between about 5% and about 30% of the processing gas.

14. A method for processing a photolithographic reticle, comprising:
- positioning the reticle on a support member in a processing chamber, wherein the reticle comprises a metal photomask layer formed on a silicon-based substrate, an anti-reflective coating disposed on the metal photomask layer and a patterned resist material deposited on the anti-reflective coating;
- etching the metal photomask layer with a processing gas for a first period of time, wherein the processing gas comprises chlorine, an inert gas, and a first oxygen gas concentration;
- increasing the oxygen concentration of the processing gas to a second oxygen gas concentration greater than the first oxygen gas concentration; and
- etching the metal photomask layer with the processing gas for a second period of time at the second oxygen concentration.

15. The method of claim 14, wherein the metal photomask layer comprises chromium and the anti-reflective coating comprises chromium oxynitride.

16. The method of claim 14, wherein the silicon-based substrate comprises an optically transparent silicon-based material selected from the group of quartz, molybdenum silicide, molybdenum silicon oxynitride, and combinations thereof.

17. The method of claim 14, wherein etching comprises maintaining the processing chamber at a pressure between about 2 milliTorr and about 25 milliTorr, maintaining the reticle at a temperature between about 50° C. and about 150° C., and generating a plasma by supplying a source RF power between about 250 watts and about 700 watts to a coil in the processing chamber.

18. The method of claim 17, further comprising applying a bias power to the support member of about 50 watts or less.

19. The method of claim 14, wherein the first oxygen concentration comprises 0% of the processing gas and the second oxygen concentration comprises between about 5% and about 45% of the processing gas.

* * * * *

UNITED STATES PATENT AND TRADEMARK OFFICE
CERTIFICATE OF CORRECTION

PATENT NO. : 7,371,485 B2 Page 1 of 1
APPLICATION NO. : 11/264189
DATED : May 13, 2008
INVENTOR(S) : Brooks et al.

It is certified that error appears in the above-identified patent and that said Letters Patent is hereby corrected as shown below:

In the Claims:

Column 14, Claim 8, Line 51, please insert --comprising chlorine and an inert gas-- before into;

Column 14, Claim 8, Line 52, please delete "comprising chlorine and an inert gas".

Signed and Sealed this

Thirtieth Day of September, 2008

JON W. DUDAS
*Director of the United States Patent and Trademark Office*